United States Patent [19]

Jenson et al.

[11] Patent Number: 4,992,753
[45] Date of Patent: Feb. 12, 1991

[54] POWER AMPLIFIER FOR A RADIO FREQUENCY SIGNAL

[75] Inventors: Ole H. Jenson, Kobenhavn, Denmark; Richard I. Little, Barrington; Joseph J. Schuler, Schaumburg, both of Ill.

[73] Assignee: Motorola, Inc., Schaumburg, Ill.

[21] Appl. No.: 415,675

[22] Filed: Oct. 2, 1989

[30] Foreign Application Priority Data

Nov. 17, 1988 [GB] United Kingdom ............... 8826918

[51] Int. Cl.$^5$ ............................................. H03G 3/20
[52] U.S. Cl. .................................. 330/129; 330/145; 330/279; 330/284; 455/116; 455/126
[58] Field of Search ............... 330/127, 129, 138, 144, 330/145, 279, 284; 375/98; 455/115–117, 126, 127

[56] References Cited

U.S. PATENT DOCUMENTS

| | | | |
|---|---|---|---|
| 4,339,724 | 7/1982 | Feher .................................... | 328/164 |
| 4,485,349 | 11/1984 | Siegel et al. ..................... | 330/145 X |
| 4,754,231 | 6/1988 | Sawa .................................... | 330/279 |
| 4,803,440 | 2/1989 | Hotta et al. ........................ | 330/145 |

FOREIGN PATENT DOCUMENTS

| | | |
|---|---|---|
| 1130871 | 8/1982 | Canada . |
| 182209 | 9/1985 | Japan .................................... 330/138 |
| 244107 | 12/1985 | Japan .................................... 330/279 |
| 2060292 | 2/1984 | United Kingdom . |
| 2154089 | 9/1987 | United Kingdom . |

Primary Examiner—James B. Mullins
Attorney, Agent, or Firm—Kenneth W. Bolvin

[57] ABSTRACT

A power amplifier is provided for amplifying a radio frequency signal such as in a burst modulation manner for use in GSM cellular radio. The amplifier has means, such as a ROM (16), for producing a predetermined sequence of values in response to a control pulse. Means (21) are provided for converting each value into a power control signal, and control means (9) are provided for controlling the amplifier output power in accordance with said power control signal. In this manner, the power/time characteristic can be made to take the form of a raised cosine. The invention also provides power selection means for selecting a nominal output level from a plurality of discrete levels and for selecting power sub-levels offset from said selected level. An indication is recorded as to which sub-level best represents the nominal power level.

15 Claims, 3 Drawing Sheets

FIG.3
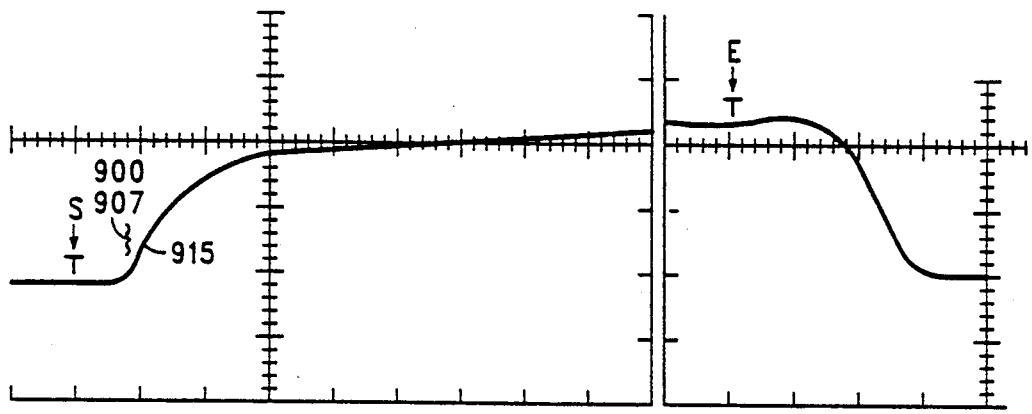
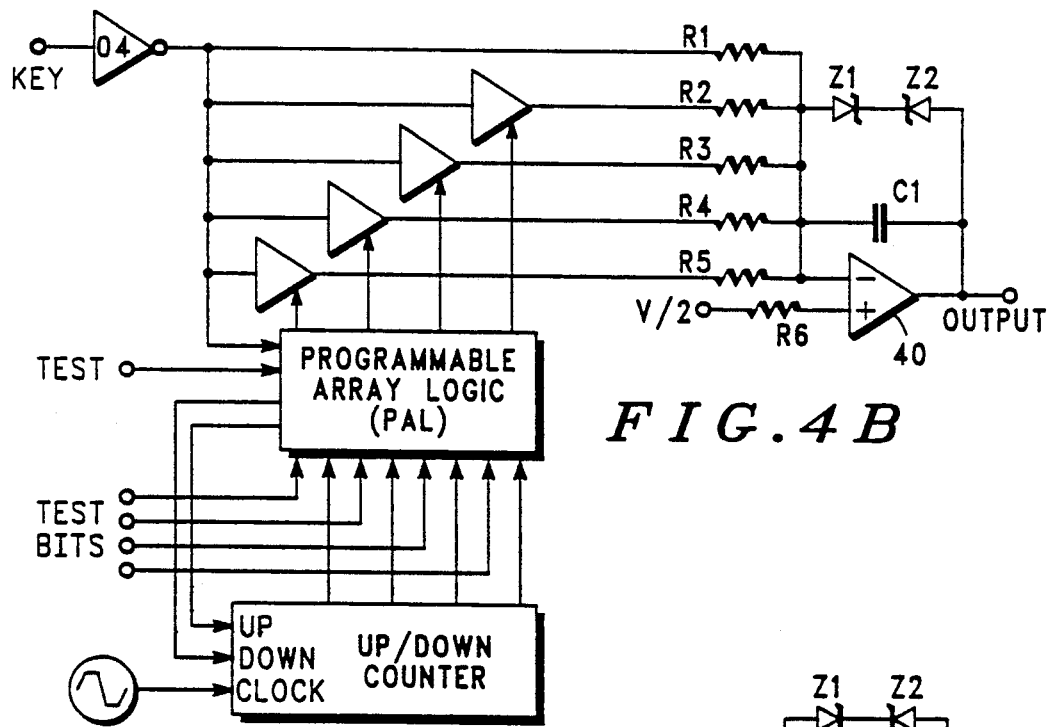
FIG.4B
FIG.4A
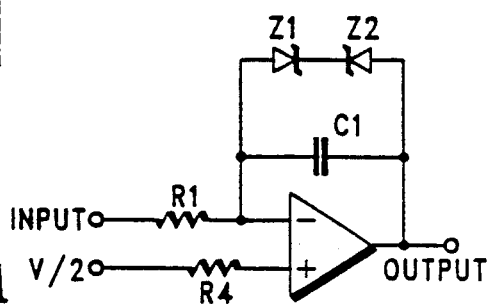

POWER AMPLIFIER FOR A RADIO FREQUENCY SIGNAL

This invention provides a power amplifier for amplifying a radio frequency signal, for example a pulsed power amplifier responsive to a control pulse. The amplifier is particularly useful for digital mobile cellular radio transmitters for use on the Pan-European GSM cellular network.

In a burst modulated power amplifier, the transmitter must observe a time domain template upon turn-on and turn-off, as well as a frequency domain template. In the past, the shape of the power characteristic as it rises at the start of a burst and falls at the end has been controlled by means of shaping circuits consisting of resistors and analog switches. Such circuits can be bulky and unreliable and have limited accuracy.

As well as the above power/time characteristic, the output power of a GSM mobile radio transmitter must be adjustable in sixteen steps from +43 dbm to +13 dbm. Many tolerance factors within the amplifier will affect the ultimate output power. Manual adjustment means can be provided for pre-setting the output power levels before the equipment leaves the factory, however separate adjustment means within the equipment for each of the sixteen power levels would be bulky, and their adjustment would be time consuming.

It is an aim of the present invention to provide an improved power amplifier to overcome some of the above problems.

According to a first aspect of the invention, a pulsed power amplifier is provided, which is responsive to a control pulse for amplifying a radio frequency signal. The amplifier comprises means for producing a predetermined sequence of values in response to each control pulse; means for converting each value to a power control signal; and control means for controlling the amplifier output power in accordance with said power control signal to provide a predetermined amplifier response function.

By this means, the time domain template on turn-on and turn-off is governed by the sequence of values. Any desired power/time characteristics can be selected and, in principle, the accuracy of the characteristic is dictated only by the number of values used and the accuracy of the samples. The Applicant has found that a raised cosine shape for the RF voltage gives rise to the minimum spectral noise. Accordingly, the samples can be determined so as to give rise to this characteristic, taking into account any non-linearities in translating the values into a RF voltage. As an alternative to a raised cosine, a gaussian shape can be used.

Preferably memory means, eg. a ROM, are used for producing the sequence of values.

According to a second aspect of the invention, a power amplifier is provided for amplifying a radio frequency signal, said amplifier comprising: power selection means for selecting a nominal output power level from a plurality of discrete levels; power control means for controlling output power in response to said power selection means; input means for indicating measured output power; and storage means responsive to the input means for storing information in response to the measured output power, for future adjustment of the selected nominal output power level. The information stored may be indication, in respect of each of said nominal output power levels, as to which of a plurality of sub-levels, offset from said selected level, gives rise to an output power closest to that nominal output power level.

In this manner, whichever of the sub-levels best representing the desired output power level is selected. As an alternative to providing preprogrammed sub-levels, preprogrammed or dynamic offsets can be used, which are added to the nominal power level values. No manual adjustment is required. The storage means records which of the sub-levels (or what offset) is to be used and that sub-level (or offset) is used thereafter. The remaining sub-levels remain unused This facilitates calibrating of the power levels before the equipment leaves the factory. It also makes recalibration of the equipment quick and simple. With modification, recalibration could be carried out automatically by the equipment itself. It also allows for dynamic power control by changing from one sub-level to another (or by changing the offset) during use to compensate for drift, temperature etc. The storage means may record, from one time slot to another, an indication of the measured output power so as to control the output power in a later time-slot.

The first and second aspects of the invention can conveniently be implemented in a single shaping ROM. For example, for sixteen levels, each having four sub-levels, the ROM merely has to store sixty-four power/time characteristics.

Preferably a feedback control loop is provided comprising sensing means for sensing output power and comparator means for receiving and comparing an output power signal from said sensing means and an output power level determining signal, wherein said power control means are arranged to control the output power so as to equalise said signals. Whereas a digital comparison (subtraction) could be made, it is preferred that said comparator means are arranged to receive said output power signal on a first input and said power determining signal on a second input, said inputs being connected to a common voltage level by means of two diodes, said diodes being adjacent each other in substantially isothermal relationship. In this manner, variations in thermal characteristics of the diode detector are effectively cancelled out. In the preferred embodiment, the output power level determining signal is derived via a digital-to-analog converter from the shaping ROM, and the feedback signal is derived from the output of the power amplifier.

A preferred embodiment of the invention will now be described with reference to the accompanying drawings, in which:

FIG. 3 shows a typical desired signal on feedback loop 13.

FIGS. 4A and 4B show circuits for use in an alternative embodiment of the invention.

Figure 1:
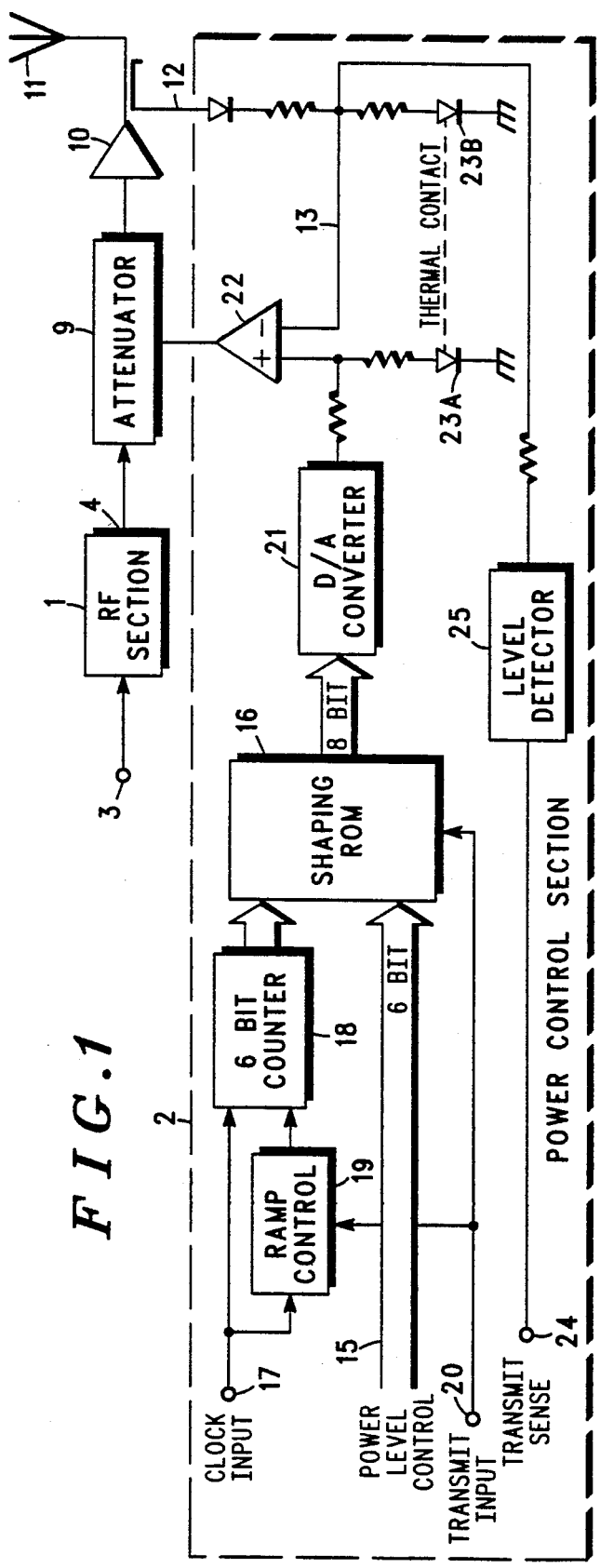
FIG. 1 shows a power amplifier for a radio transmitter, in accordance with the present invention.

Referring to FIG. 1, an RF section 1 is shown and a power control section 2. The RF section has a input 3 for receiving data to be transmitted and an output 4 for providing an RF signal for transmission. The RF signal is fed to attenuator 9 and RF power amplifier 10. The output of power amplifier 10 is fed to the antenna 11.

From the output of the power amplifier 10, there is also a level sensor 12, which is connected to a feedback loop 13 in the power control section 2.

Figure 2:
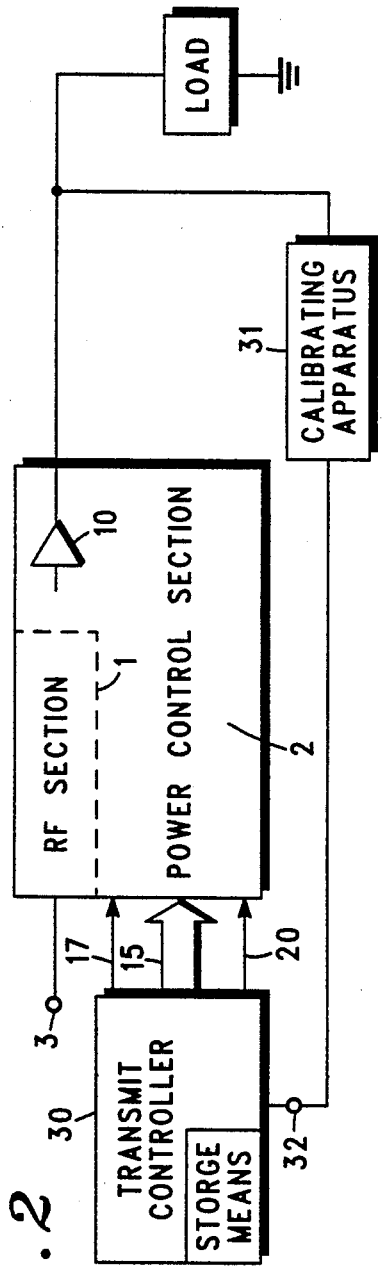
FIG. 2 is a block diagram showing the power amplifier of FIG. 1 during calibration of power levels.

The power control section 2 has a six-bit power control input 15, which is connected to the address lines of a shaping ROM 16 The power control section 2 also has a clock input 17, which is fed to a six-bit counter 18 which in turn is connected to a further six address bits of the shaping ROM 16. A ramp control unit 19 is connected to the input of the six-bit counter 18 and is controlled by the clock 17 and a transmit input 20. ROM 16 provides an eight-bit output which is fed to a digital-to-analog converter 21, from which the resulting analog signal is fed via comparator amplifier 22 to the attenuator 9 of the power amplifier section 1. The negative input of comparator amplifier 22 is connected to the level sensor 12 via the feedback loop 13. Each of the inputs of the comparator amplifier 22 has a biasing diode 23a and 23b, connecting it to ground. The diodes 23a and 23b are in close thermal contact on the same chip. This feature has the advantage of eliminating the thermal coefficient of the diode detector. A transmit-sense line 24 is provided, leading from the output power level sensor 12, via a level detector 25 to the transmit controller 30 (FIG. 2)

The operation of the amplifier is as follows.

The transmitter transmits at a frequency from 890–915 MHz and receives at a frequency 45 MHz higher. The transmitter is active for approximately one time slot in every frame. A frame is 4.615 ms long and consists of eight time slots. The time slot duration is 577 µs, which is 156.25 bits. The transmitter is active for only 147 bits or 543 µs.

To transmit, the transmit controller 30 selects a power level on power level control lines 15 provides a transmit control pulse on line 20 and provides data to be transmitted on input 3. The output power template, i.e. the output power/time characteristic, is controlled by counter 18, ramp control 19 and shaping ROM 16. When the transmit key 20 indicates start of transmission (S-FIG. 3), ramp control 19 controls start of ramping, whereupon it counts 64 pulses (or some other number) to terminate ramping. When the transmit key indicates end of transmission (E), ramp control 19 causes counter 18 to ramp down again through a different set of values. As the transmit pulse progresses, counter 18 counts the input clock pulses 17 and addresses ROM 16 accordingly. Thus, for a given nominal power level, ROM 16 dictates the output characteristic and the output power is controlled accordingly by means of digital-to-analog converter 21, comparator 22 and attenuator 9. For a different nominal power level, a different characteristic is addressed by means of different addresses on power control input 15.

The six power level control bits at input 15 serve to ease the achievement of correct output power levels. There are sixteen nominal power levels and each nominal power level is split into four sub-levels close to the nominal value. Periodically, the transmit controller carries out an output power test, during which it sets the power to all the 64 possible power output values in turn. The corresponding output powers are measured by external power measuring means in the form of calibrating apparatus 31. The transmit controller is then told by means of an input 32 which of the sub-levels is the best to represent each one of the sixteen nominal output power levels. The result is stored in storage means in the transmit controller 30. Thereafter, the actual output power levels will be correct.

The characteristic stored in the shaping ROM is an approximation to a raised cosine By this means, the power up/down ramp is slowed down, in order to reduce the spectral noise in adjacent channels due to the burst modulation. The degree of approximation to the cosine is limited by the step nature of the characteristic stored in the ROM 16.

The above description has been given by way of example only, and modification of detail can be made within the scope of the invention. Thus, for instance, the power templates stored in ROM 16 could be subdivided into fewer or more time divisions by decreasing or increasing the clock rate 17 and selecting the count ratio of counter 18 accordingly. Likewise, fewer or more power sub-levels could be provided, and the number of power level control lines 15 and capacity of ROM 16 would need to be selected accordingly. Likewise, greater or lesser accuracy can be achieved from ROM 16 by providing more than eight bits or less than eight bits to the digital-to-analog converter 21.

The above features of sampling rate variation and resolution could be adapted to, or made a function of, different power levels or other parameters.

The power amplifier is not solely applicable to QPSK transmitters, nor even to burst modulated transmission. The amplifier could be used in radio transmitters other than for the GSM network, for example in two-way radio. Thus, for power level control of a continuous signal, counter 18 and ramp control 19 can be omitted, leaving a such reduced ROM 16, which merely stores the power levels for the four sub-levels of each of the sixteen nominal power levels. Similarly, for control of a burst modulated transmission at a single power level, power level control lines 15 could be omitted.

The output power is adjustable in 16 steps from the +43 dbm to +13 dbm.

To avoid generating step noise and glitches potentially arising from digital steps in power level, a simple integrator can be used to convert a step input into a slope that is linear with respect to time. Usually, however when an integrating amplifier is operating at a supply rail, it is slow in responding, and also the negative input is not at virtual ground, enabling some coupling of the input to the output. FIG. 4A shows the use of a pair of back-to-back zener diodes, Z1 and Z2, that will limit the output to plus or minus the zener voltage, and keep the input at virtual ground. This circuit generates ramps that are determined solely by R1 and C1 and the input amplitude.

FIG. 4B shows a circuit in which the effective value of R1 is modulated (by selectively switching R2–R5 into parallel connection with R1) and C1 and the input amplitude are held constant. The input signal is derived from a CMOS gate of negligible resistance (compared to R1), and thus of constant amplitude (+6 to ground). The positive input of the operational amplifier 40 is biassed to half of the CMOS voltage, so that the input swing relative to the virtual ground is symmetrical. The output will swing from this reference up approximately Z1 volts and down approximately Z2 volts, (plus a little more due to forward diode drops). For the purposes of describing the operation, the Key signal enters at a 74HC04, which, from a logic input produces a step from +6 volts Off to ground On and back to +6 volts at turn-off R1–C1 develops a very gentle ramp, so that just before a step is to be executed the output will be on a rail. R2–R5 are all lower value resistors than R1, in the ratio 8:4:2:1, so that in combination of one or more, will develop fifteen different net values of resistance against which C1 can work to develop ramps of different slopes, and are switched so as to modulate the slope of the output waveform.

There are many ways to generate the slope switching. For purposes of explanation, a programmable array logic (PAL) for a common table look-up and count control is employed. An oscillator provides a clock fast enough to provide a multiple of pulses to an up/down counter during a ramp. It will advance the counter until the table look-up reaches a prescribed count, at which point the table cuts off further counting until key-down is sensed, at which time the counter will count down. The counter's state is combined with the key signal in the PAL to provide a translation to slope, so that the slope profile can be different for key-up and key-down, and need not dwell equally on each slope increment, or indeed even use all of the 15 increments available in this embodiment. Indeed, it may even be desirable to use more than four switched resistors (of binade ratio) or use some other ratio.

The PAL also provides a test override so that during testing, external signals have control of the slope. These are arranged so that if no external signals are connected when the test input is grounded, the slope will be maximum. Slope maximum is useful in determining the proper value for C1.

The embodiment of FIG. 4 is capable of generating a smoother transition with fewer steps than the embodiment of FIG. 1.

Figure 5:
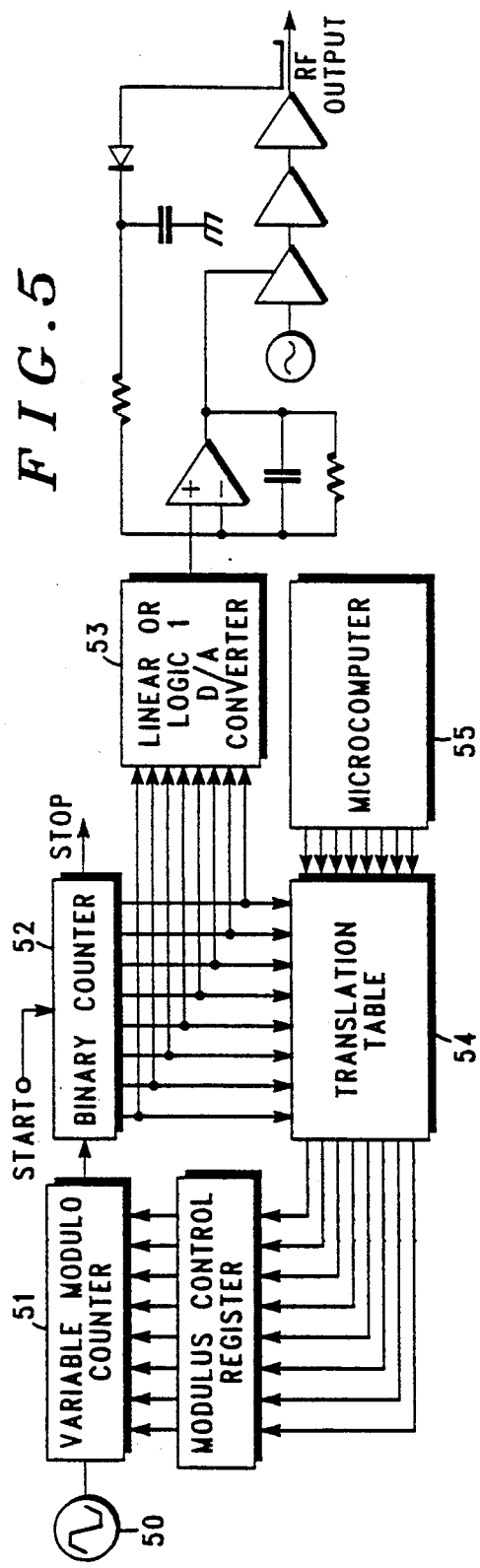
FIGS. 5 and 6 show further circuits for use in alternative embodiments of the invention, incorporating a variable time base.

FIG. 5 illustrates a further embodiment of the invention. In this embodiment, a high rate digital clock 50 feeds a variable modular counter 51, which, when keyed down, divides by 1 or 2, thus providing a high rate clock having selectable clock rates to a binary ramp counter 52. The counter 52 is locked from counting until key-up (point S in FIG. 3). The counter feeds a digital-to-analog converter 53, the filtered output of which controls the RF power level. The counter also feeds a modulo translation table 54, which establishes how many digital clocks are required to advance the binary ramp counter 52 by one step. A controlling microcomputer 55 loads the modulo translation table 54 with the desired ramp up and down information for all the steps, including key-up transmit time and key-down. Upon a start command (to key up the transmitter), the counter 52 steps off. The period of each step thereafter becomes a function of the translation.

Figure 6:
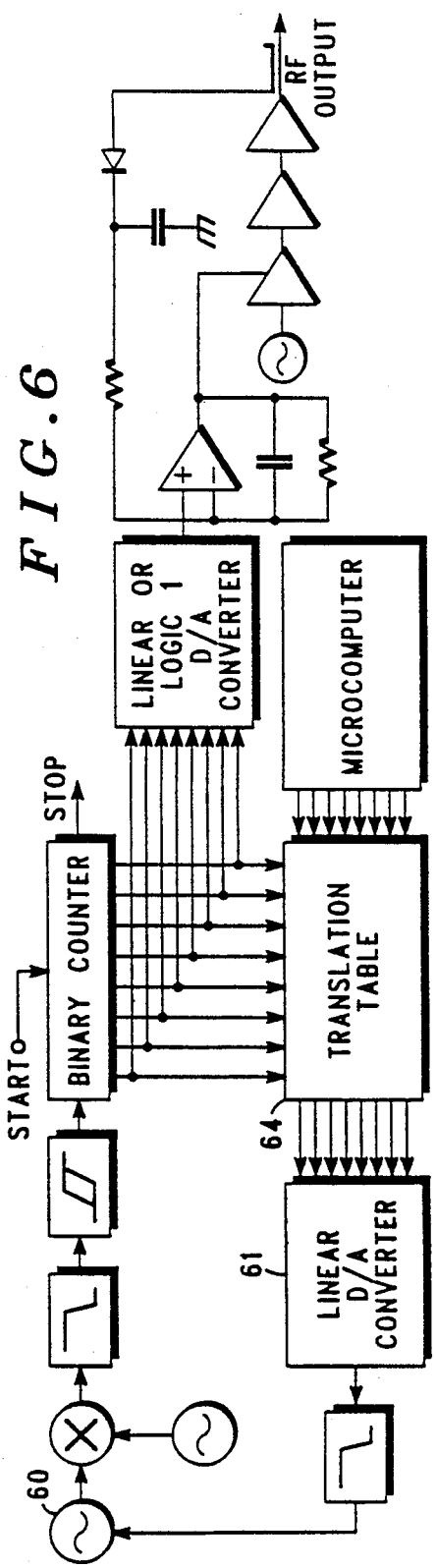

As a practical matter, the digital clock 50 must be faster that the desired ramp speed. A 50 MHZ clock could usually provide about 100:1 time base to a ramp in the 10–50 microsecond range. An alternative method would use a VCO 60 as depicted in FIG. 6, controlled by a linear D/A converter 61 driven from the translation table 64. The range of the VCO might be expanded by mixing and offsetting it. For example a VCO spanning the range 50–60 MHZ mixed against a 49 MHZ signal will yield 1–11 MHZ, more linearly than could easily be generated from a 1–11 MHZ VCO directly.

Instead of controlling attenuator 9 with the signal from comparator 22, a power amplifier with variable gain control can be used and the signal from comparator 22 can adjust the gain.

Temperature measuring means may also be provided, and a further look-up table responsive thereto for generating a temperature compensating power offset signal to adjust the output power to compensate for temperature changes.

It will, of course, be understood that the above description has been given by way of example only and that modifications of detail can be made within the scope of the invention.

We claim:

1. A pulsed power amplifier responsive to a control pulse for amplifying a radio frequency signal, said pushed power amplifier comprising:
   means for producing a predetermined sequence of values in response to each control pulse;
   means for converting each value to a power control signal; and
   control means for controlling the amplifier output power in accordance with said power control signal to provide a predetermined rising and falling amplifier response function;
   whereby said rising and falling amplifier response function defines a pulse of output power.

2. An amplifier according to claim 1, wherein said means for producing a sequence of values includes memory means for storing said sequence of values, and means responsive to said control pulse for reading said stored sequence of values out of said memory means.

3. An amplifier according to claim 2, wherein the means for converting the values into a power control signal includes integrating means for smoothing the transition of the output power from one value to the next.

4. An amplifier according to claim 3 wherein the integrating means has a variable time constant which is arranged to vary as a function of the sequence of values, thereby to provide the power control signal.

5. An amplifier according to claim 1 having a clock arranged to generate the values in sequence, at a rate corresponding to the clock rate, wherein the clock rate is variable throughout the sequence.

6. An amplifier according to claim 1, further comprising power level selection means; said means for producing a sequence of values being arranged to produce a separate sequence for each power level selected by the selection means.

7. A power amplifier according to claim 1, wherein a feedback control loop is provided comprising sensing means for sensing output power and comparator means for receiving and comparing an output power signal from said sensing means and an output power level determining signal, wherein said power control means for arranged to control the output power so as to equalise said signals.

8. A power amplifier according to claim 7, wherein said comparator means are arranged to receive said output power signal on a first input and said power determining signal on a second input, said inputs being connected to a common voltage level by means of two diodes, said diodes being adjacent each other in substantially isothermal relationship.

9. A power amplifier according to claim 1, further comprising:
   power selection means for selecting a nominal output power level from a plurality of discrete levels;
   input means for measuring output power; and
   storage means responsive to the input means for storing information in response to the measured output power, for future adjustment of the selected nominal output power level.

10. A power amplifier for amplifying a radio frequency signal, said amplifier comprising:
  power selection means for selecting a nominal output power level from a plurality of discrete levels;
  power control means for controlling output power in response to said power selection means;
  input means for measuring output power; and
  storage means responsive to the input means for storing information in response to the measured output power, for future adjustment of the selected nominal output power level;
  wherein the power selection means comprises means for selecting power sub-levels offset from said selected nominal output power level;
  and wherein the storage means comprises means for recording, in respect of each of said nominal output power levels, which of said sub-levels gives rise to an output power closest to that nominal output power level.

11. An amplifier according to claim 10, further comprising a transmitter controller arranged to select a nominal transmit power level, select various power sub-levels offset from that level, store information indicative of the said closest sub-level and repeat the process for each other nominal transmit power level in turn.

12. A power amplifier according to claim 10, wherein a feedback control loop is provided comprising sensing means for sensing output power and comparator means for receiving and comparing an output power signal from said sensing means and an output power level determining signal, wherein said power control means are arranged to control the output power so as to equalize said signals.

13. A power amplifier according to claim 12, wherein said comparator means are arranged to receive said output power signal on a first input and said power determining signal on a second input, said inputs being connected to a common voltage level by means of two diodes, said diodes being adjacent each other in substantially isothermal relationship.

14. A method of controlling output power in amplification of a radio frequency signal by a pulsed power amplifier, comprising the steps of:
  producing a series of values in response to a control pulse, each value having a different predetermined amplitude related to a predetermined response function;
  converting each value to an analog signal and controlling the amplifier output power in accordance with said analog signal.

15. A method of adjusting output power in amplification of a radio frequency signal, comprising the steps of:
  selecting a nominal output power level from a plurality of discrete levels;
  selecting power sub-levels offset from said selected nominal level;
  controlling output power in response to said selection of level and sub-levels; and
  measuring the actual output power, recording which of said sub-levels gives rise to an output power closest to the selected nominal output power level;
  repeating the above steps for each nominal output power level; and
  adjusting a selected nominal output power level at a later time dependent on the stored information.

* * * * *

UNITED STATES PATENT AND TRADEMARK OFFICE
CERTIFICATE OF CORRECTION

PATENT NO.   :   4,992,753
DATED        :   February 12, 1991
INVENTOR(S)  :   Ole H. Jensen, Richard I. Little and Joseph J. Schuler It is certified that error appears in the above-identified patent and that said Letters Patent is hereby corrected as shown below:

In Column 6, line 10, please delete the word "pushed" and replace with --pulsed--.

On the title page, item [75] Inventors: the inventor's name is misspelled. Please change the name "Jenson" to --Jensen--.

Signed and Sealed this

Twenty-fifth Day of August, 1992

*Attest:*

DOUGLAS B. COMER

*Attesting Officer*     *Acting Commissioner of Patents and Trademarks*